US007706168B2

(12) United States Patent
Fang et al.

(10) Patent No.: US 7,706,168 B2
(45) Date of Patent: Apr. 27, 2010

(54) ERASE, PROGRAMMING AND LEAKAGE CHARACTERISTICS OF A RESISTIVE MEMORY DEVICE

(75) Inventors: Tzu-Ning Fang, Palo Alto, CA (US);
Steven Avanzino, Cupertino, CA (US);
Swaroop Kaza, Sunnyvale, CA (US);
Dongxiang Liao, Sunnyvale, CA (US);
Christie Marrian, San Jose, CA (US);
Sameer Haddad, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 175 days.

(21) Appl. No.: 11/980,116

(22) Filed: Oct. 30, 2007

(65) Prior Publication Data

US 2009/0109727 A1     Apr. 30, 2009

(51) Int. Cl.
*G11C 11/00*      (2006.01)

(52) U.S. Cl. .................. 365/148; 365/113; 365/163

(58) Field of Classification Search .................. 365/100, 365/113, 148, 163
See application file for complete search history.

(56) References Cited

U.S. PATENT DOCUMENTS

| 6,977,181 | B1* | 12/2005 | Raberg ................. 438/3 |
| 7,236,388 | B2* | 6/2007 | Hosoi et al. ............ 365/148 |
| 2006/0289942 | A1* | 12/2006 | Horii et al. ............ 257/379 |
| 2008/0219039 | A1* | 9/2008 | Kumar et al. .......... 365/148 |
| 2008/0220601 | A1* | 9/2008 | Kumar et al. .......... 438/585 |
| 2008/0278990 | A1* | 11/2008 | Kumar et al. .......... 365/148 |
| 2009/0108247 | A1* | 4/2009 | Takaura et al. ......... 257/2 |

* cited by examiner

*Primary Examiner*—Gene N. Auduong

(57) ABSTRACT

The present method provides annealing of a resistive memory device so as to provide that the device in its erased state has a greatly increased resistance as compared to a prior art approach. The annealing also provides that the device may be erased by application of any of a plurality of electrical potentials within an increased range of electrical potentials as compared to the prior art.

19 Claims, 10 Drawing Sheets

Fig 1. Leakage vs. annealing temperature for Ta/TaOx/Al

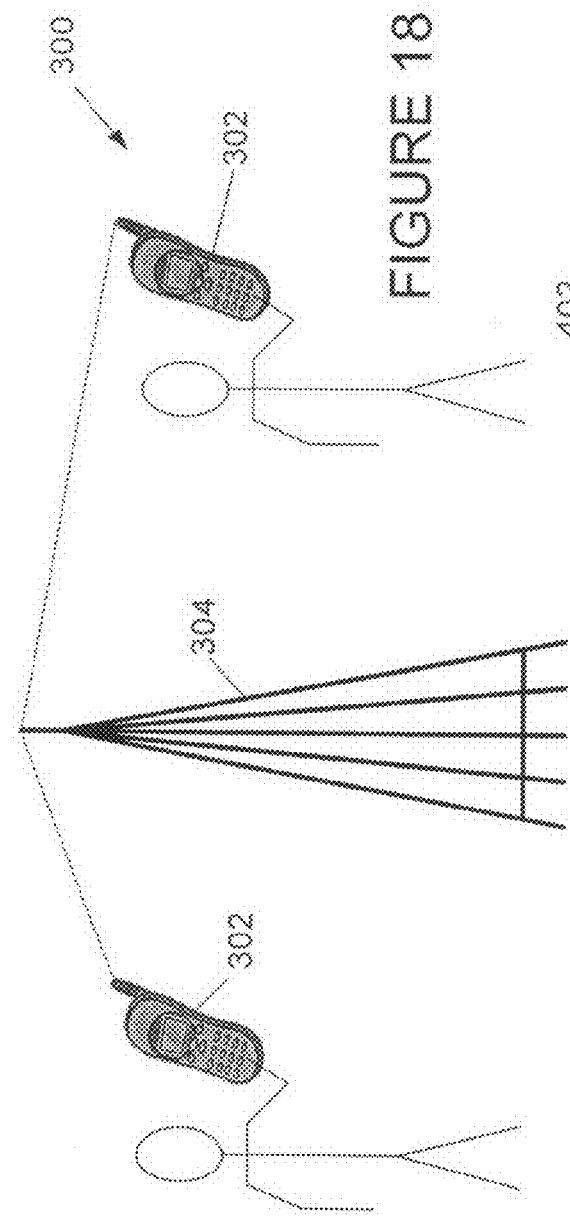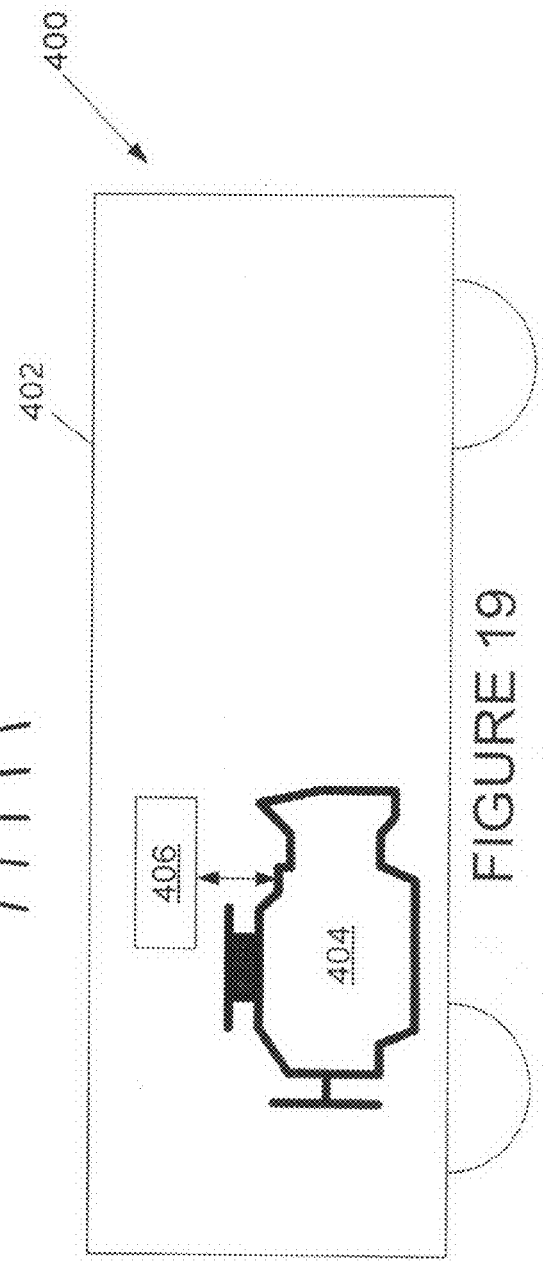

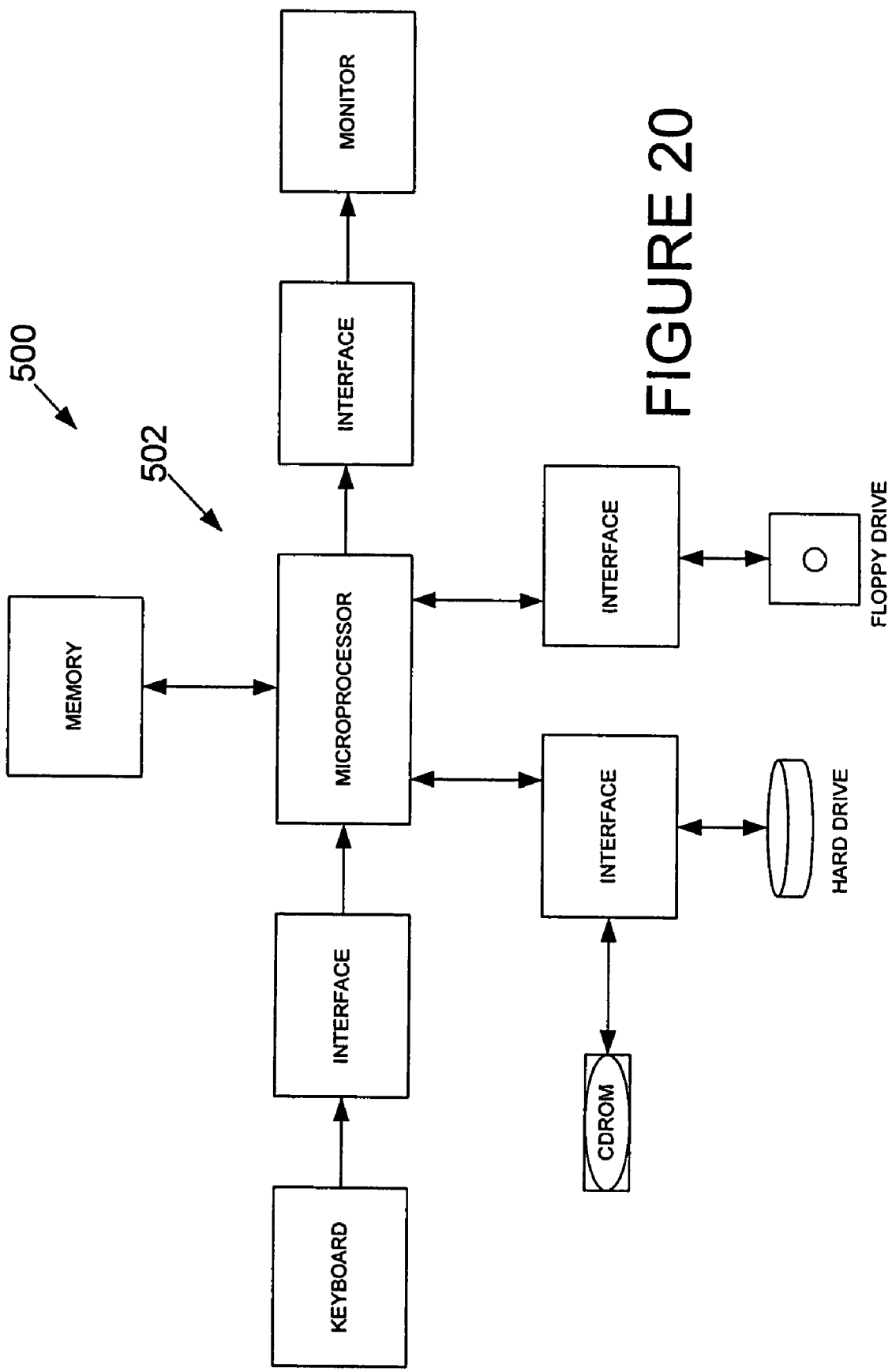

ERASE, PROGRAMMING AND LEAKAGE CHARACTERISTICS OF A RESISTIVE MEMORY DEVICE

BACKGROUND OF THE INVENTION

1. Technical Field

This invention relates generally to resistive memory devices, and more particularly, to methods for improving performance of resistive memory devices.

2. Background Art

Recently, resistive memory devices have been developed for use in storage applications in electronic devices. A typical resistive memory device is capable of selectively being placed in a low resistance ("programmed") state and a high resistance ("erased") state. The state of the device is read by providing an electrical potential across the device and sensing the level of current through the device. These devices are appropriate for use in a wide variety of electronic devices, such as computers, personal digital assistants, portable media players, digital cameras, cell phones, automobile engine controls and the like. While such devices have proven effective in use, it will be understood that it is desirable to improve performance thereof. For example, improvements in erase performance and reduced current leakage are being sought.

FIGS. 1-5 illustrate a metal-insulator-metal (MIM) resistive memory device 20 and operating characteristics thereof. With reference to FIG. 1, the device 20 includes a Ta or TaN bottom electrode 22, a deposited or grown Ta oxide layer 24 on the electrode 22, and a top Al electrode 26 deposited on the Ta oxide layer 24, which deposition, undertaken at a temperature of for example 190° C., causes formation of a thin (for example ~20 angstroms thick) Al oxide layer 25 between the Ta oxide layer 24 and the electrode 26, so that Ta oxide layer 24 and Al oxide layer 25 make up the insulating layer of the MIM device 20. The electrode 22 is connected to a transistor 28 so that the device 20 is in series with the transistor 28.

The programming of the device 20, i.e., the changing of the device 20 from a high resistance (erased) state to a low resistance (programmed) state is described with relation to FIGS. 2 and 5, the curve A illustrating programming characteristics of the device 20. As shown therein, a positive voltage +V is applied to the electrode 26, while terminal 23 is held at ground, so that higher to lower potential is applied in the direction from electrode 26 to electrode 22. This potential is increased (by increasing +V applied to electrode 26 and holding terminal 23 at ground), resulting in current flow with increasing potential as shown at A1. When this potential reaches ~5.3V, the device 20 switches into a low resistance state (indicated at A2), and current increases rapidly with increased potential until current is limited to a selected level A3 by current limiting transistor 28 (gate voltage $V_{g1}$).

Erasing of the device 20, i.e., the changing of the device from a low resistance (programmed) state to a high resistance (erased) state is described with relation to FIGS. 3 and 5, the curve B illustrating erasing characteristics of the device 20. As shown therein, a positive voltage +V is applied to the terminal 23, while the electrode 26 is held at ground, with $V_{g2}$ applied to the gate of the transistor 28 greater than $V_{g1}$ of FIG. 2, so that higher to lower potential is applied in the direction from electrode 22 to electrode 26. This potential is increased (by increasing +V applied to terminal 23 and holding electrode 26 at ground), resulting in current flow with increasing potential as shown at B1. When this potential reaches ~1.2V, the device 20 switches into an erased (high resistance) state (indicated at B2). With further increase in this potential, the device 20 remains in its erased state until the potential reaches ~1.8V, whereupon the device 20 switches back to its programmed (low resistance) state (indicated at B3).

The memory device 20 may be erased using a second approach (FIGS. 4 and 5). In this approach, the erase electrical potential is applied across the memory device 20 from higher to lower potential in the direction from the electrode 26 to the electrode 22, i.e., in the same direction as applied in the programming of the device 20, by applying +V to the electrode 26 and holding terminal 23 at ground.

The increase in resistance from the conductive state to the erased state (indicated by small decrease in current E1, FIG. 5) is relatively small. This shallow erase causes relatively small ON-OFF ratio, i.e., the ratio of the ON state resistance to the OFF state resistance. Increasing the voltage V+ does not improve the situation as it has been found that further increase in V+ does not increase the level of erase resistance and that after a relatively small increase in V+, the device returns to its programmed state (FIG. 5).

Furthermore, the range of potentials R1 which achieve erasure of a programmed device 20 is relatively small, i.e., 0.6V, that is, any of a plurality of applied potentials in the range or window from ~1.2V to ~1.8V will achieve erase of a programmed device 20. However, an applied potential outside this range R1 will not provide an erased state of a programmed device 20. Control of the erase potential so that it falls within such a small range R1 can be problematical.

DISCLOSURE OF THE INVENTION

Broadly stated, the present invention is a method undertaken on a resistive memory device which has a resistance in an erased state. The method comprises providing that the memory device has in said erased state a second resistance different from the first-mentioned resistance.

Broadly stated, the present invention is method of providing an erase characteristic of a resistive memory device which may be erased by application thereto of any of a plurality of electrical potentials within a range of electrical potentials. The method comprises providing that the resistive memory device may be erased by application thereto of any of a plurality of electrical potentials within a second range of electrical potentials different from the first-mentioned range of electrical potentials.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

FIGS. 18-20 illustrate systems incorporating the present invention.

BEST MODE(S) FOR CARRYING OUT THE INVENTION

Reference is now made in detail to a specific embodiment of the present invention which illustrates the best mode presently contemplated by the inventors for practicing the invention.

Figure 6:
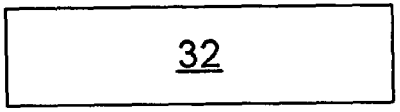
FIG. 6-10 illustrate the fabrication of a memory device in accordance with the present invention.
Figure 7:
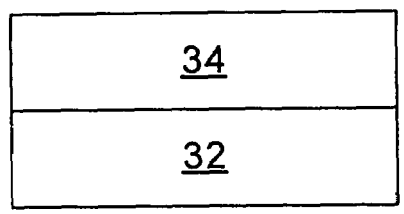
Figure 8:
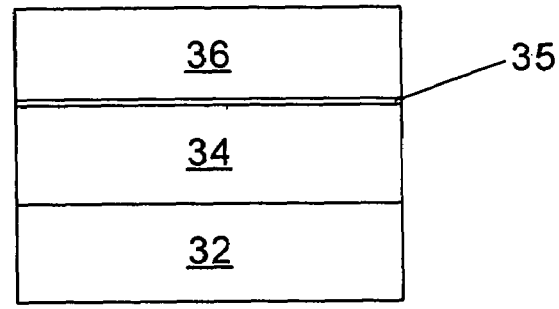
Figure 9:
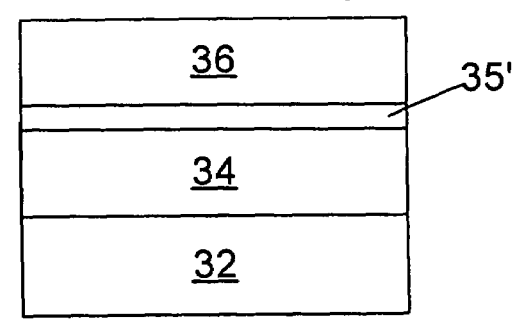
Figure 10:
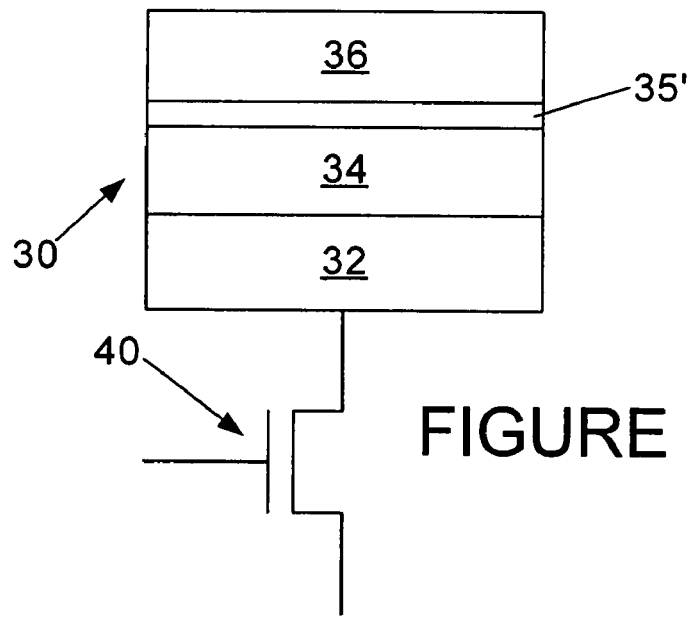

FIGS. 6-10 illustrate the fabrication of a metal-insulator-metal (MIM) resistive memory device 30 in accordance with the present invention. Initially, as shown in FIG. 6, a Ta or TaN electrode 32 is provided. A Ta oxide layer 34 is provided on the electrode 32 (FIG. 7). This layer 34 may be either grown or deposited on the electrode 32. An Al electrode 36 is then deposited on the Ta oxide layer 34. The deposition temperature of the aluminum may be for example 190° C. Deposition of the aluminum on the Ta oxide layer 34 at this elevated temperature causes a portion of the aluminum to oxidize, forming a thin (for example ~20 angstroms thick) Al oxide layer 35 on the Ta oxide layer 34 (FIG. 8). Then, an annealing step, i.e., a heating step followed by gradual cooling is undertaken. The temperature of the heating step is preferably in the range of from 350-400° C. for Ta electrode 32, or 375-500° C. for TaN electrode 32. This heating causes the aluminum of the electrode 36 to further react with the Ta oxide layer 34, increasing the thickness of the Al oxide layer 35' and forming a mixture of Ta oxide Ta and Ta atoms (FIG. 9). The Ta oxide layer 34 and Al oxide layer 35' make up the insulating layer of the device 30. The electrode 32 is connected to a transistor 40 so that the transistor 40 is in series with the device 30 (FIG. 10).

Figure 1:
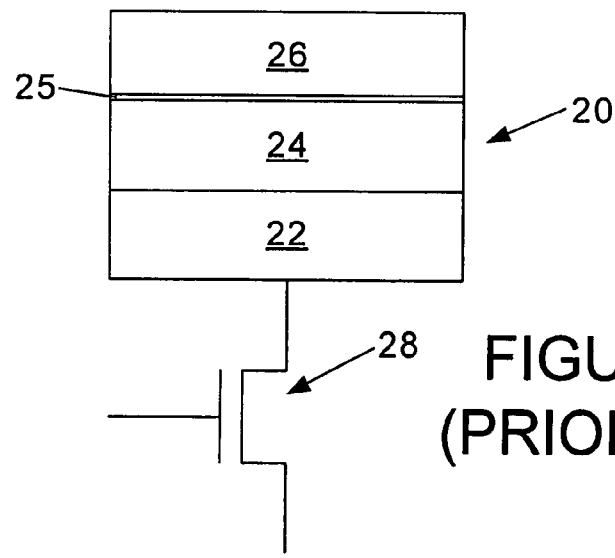
FIGS. 1-5 illustrate a previous memory device and performance characteristics thereof.
Figure 2:
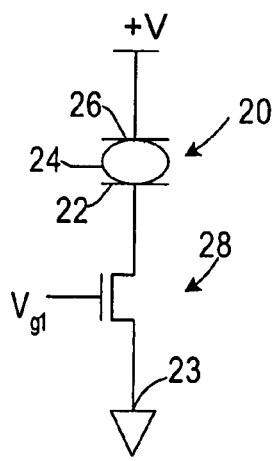
Figure 11:
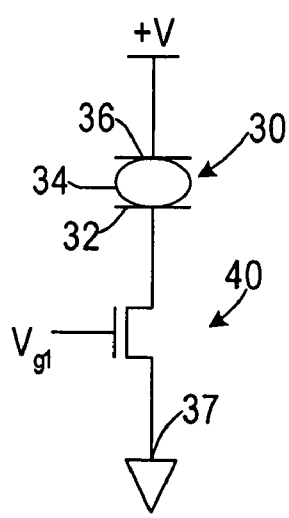
FIGS. 11-13 illustrate programming and erasing of the device of FIG. 10.
Figure 14:
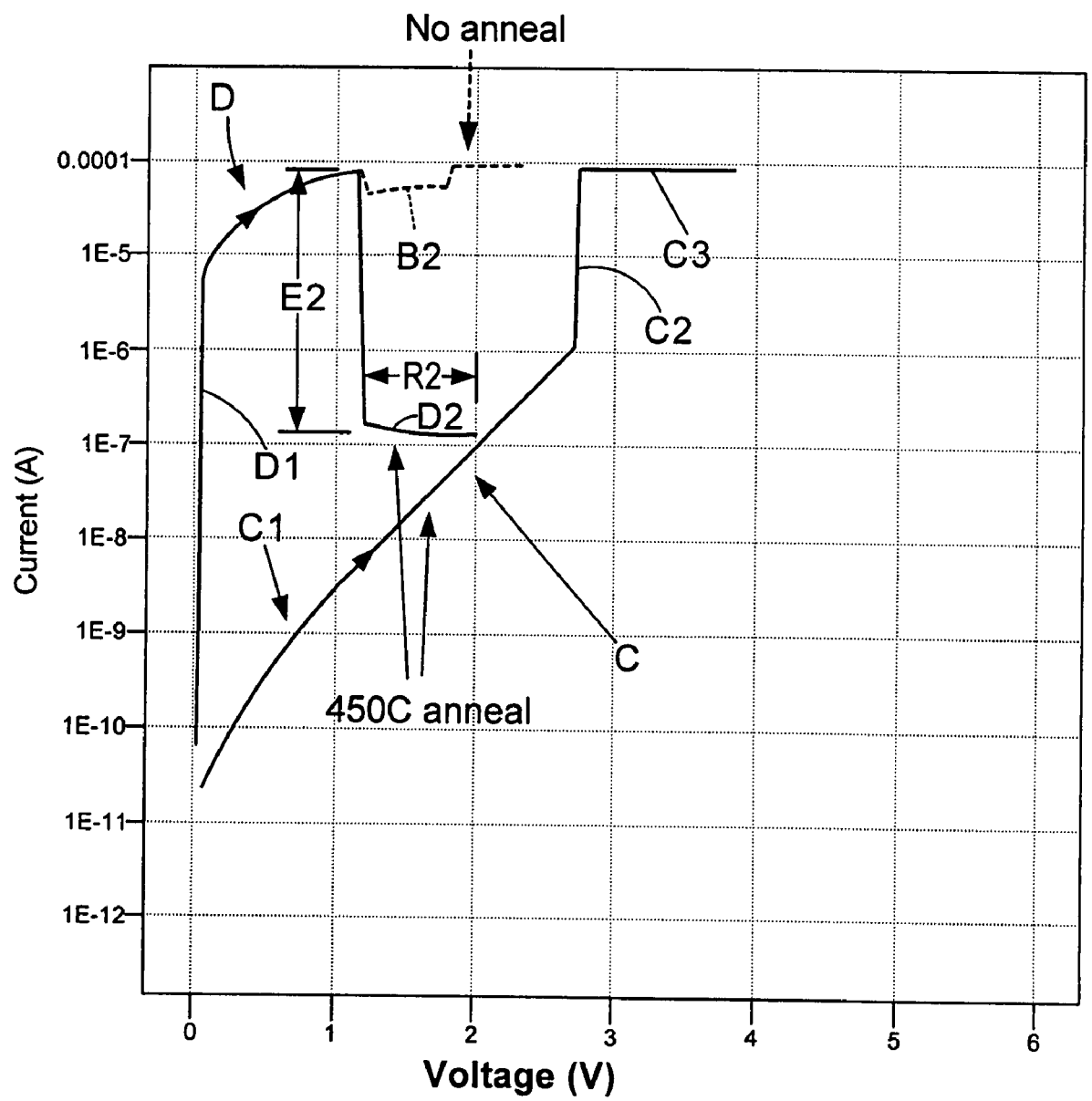
FIGS. 14 and 15 illustrate performance characteristics of the present memory device.

With the device at room temperature, the programming of the device 30, i.e., the changing of the device 30 from a high resistance (erased) state to a low resistance (programmed) state is undertaken as described above with regard to FIG. 11, and with reference to FIG. 14. The curve C illustrates programming characteristics of the device 30. As shown therein, and as previously described with regard to FIG. 2, with $V_{g1}$ applied to the gate of the transistor 40, a positive voltage V+ is applied to the electrode 36, while the terminal 37 is held at ground, so that higher to lower potential is applied in the direction from electrode 36 to electrode 32. This potential is increased (by increasing +V applied to electrode 36 and holding terminal 37 at ground), resulting in current flow with increasing potential as shown at C1. When this potential reaches ~2.7V, the device 30 switches into a low resistance state (indicated at C2), and current increases rapidly with increased potential until current is limited to a selected level C3 by transistor 40. The programming threshold in this case (indicated at C2 in FIG. 14) is significantly reduced as compared to the previous (without annealing) approach which has a programming voltage ~5.3V (indicated at A2 in FIG. 5).

Figure 3:
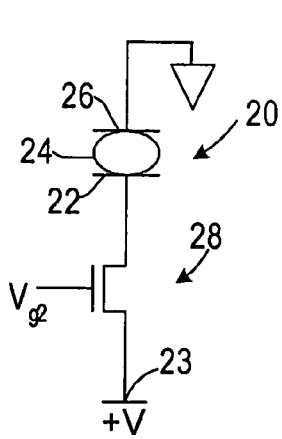
Figure 12:
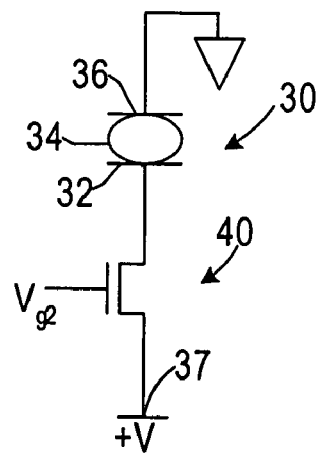

Also with the device at room temperature, the erasing of the device 30, i.e., the changing of the device 30 from a low resistance (programmed) state to a high resistance (erased) state, is undertaken as described above with regard to FIG. 12, and with reference to FIG. 14. The curve D illustrates erasing characteristics of the device 30. As shown therein, and as previously described with regard to FIG. 3, with $V_{g2}$ (greater than $V_{g1}$) applied to the gate of the transistor 40, a positive voltage +V is applied to the terminal 37, while the electrode 36 is held at ground, so that higher to lower potential is applied in the direction from electrode 32 to electrode 36. This potential is increased (by increasing +V applied to terminal 37 and holding electrode 36 at ground), resulting in current flow with increasing potential as shown at D1. When this potential reaches ~1.1V, the device 30 switches into an erased (high resistance) state (indicated at D2). With further increase in this potential (up to at least ~2.0V applied to terminal 37), the device 30 remains in its erased state.

Figure 4:
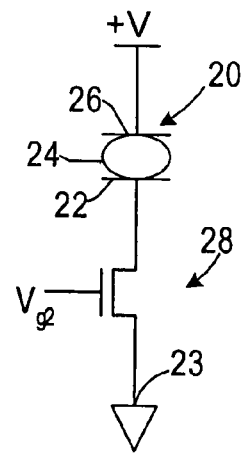
Figure 13:
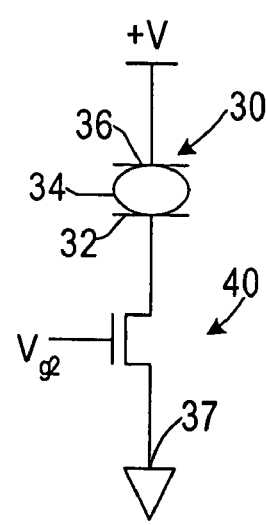

The device 30 may also be erased as shown and described with regard to FIG. 13, similar to the approach of FIG. 4.

Figure 5:
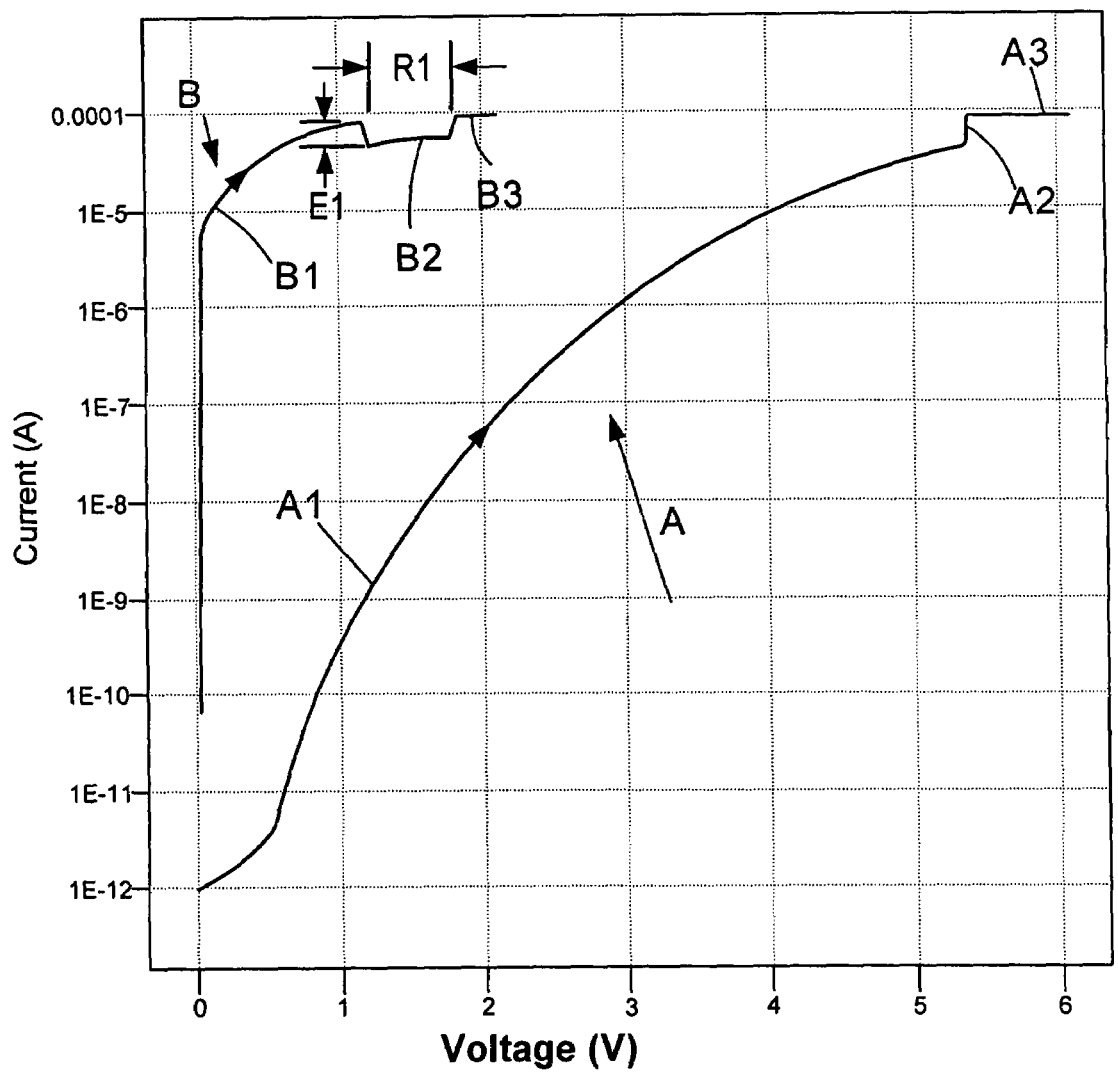

FIG. 14 illustrates that the resistance level of the device 30 in its erased state is greatly increased as compared to the previous (without annealing) approach (note much greater decrease in current indicated at E2 as compared to E1 of FIG. 5). Erase depth is greatly increased when the anneal temperature is equal to or greater than 375° C. in the case where the electrode 32 is TaN, and when anneal temperature is equal to or greater than 350° C. in the case where the electrode 32 is Ta. With this much deeper erase as compared to the prior art, a much higher ON-OFF ratio is achieved, so that erase criteria have been properly met.

Furthermore, this greatly increased resistance is maintained upon substantial increase in applied V+. As illustrated in FIG. 14, the increased resistance, taking place at 1.2V, is maintained with increased applied voltage until application of at least ~2.0 volts (range R2). The range of potentials R2 which achieve erasure of a programmed device 30, it will be seen, is substantially greater than as previously described, in this case being ~0.9V as compared to the previous ~0.6V. That is, the present device 30 may be erased by application of any of a plurality of applied potentials in the range or window from ~1.1V to ~2.0V. As will be seen, the range R1 of the previous approach lies within the present range R2 (see FIG. 14, wherein a portion B2 of the erase curve B of FIG. 5 is included in FIG. 11 for comparison).

Figure 15:
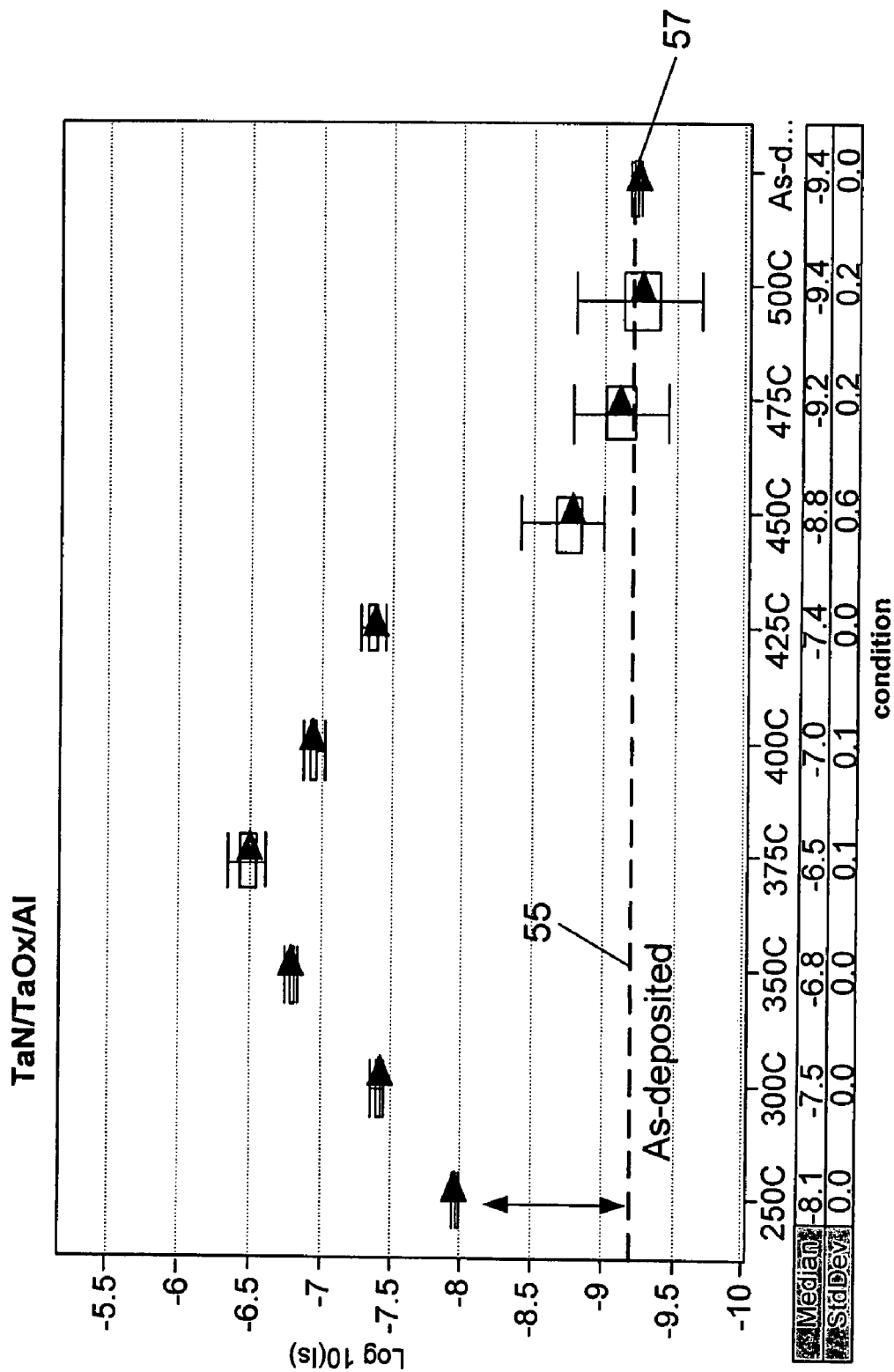

The annealing process described above has also been found to decrease current leakage with the device 30 in a high resistance (erased) state. This is illustrated in FIG. 15 for a device with a TaN electrode 32. The dotted horizontal line 55 illustrates leakage of a group of such erased devices 30 prior to the annealing being undertaken. For this test, a potential of 1V is applied across each device 30. A sequence of annealing steps (each including heating and cooling to room temperature) is undertaken, at the temperatures noted in FIG. 15. After each cooling step, that potential (1V) is applied to the devices 30 and leakage current therethrough is measured. Each arrow pointing to the right indicates the median value of current for a group of devices 30 so tested. As will be seen, leakage current increases up to and including an annealing temperature of 375° C., and then decreases with increased annealing temperature, being very low at for example the annealing temperature set forth above of 450° C., comparable to that after provision of the electrode 36 (FIG. 8), indicated at level 57 of FIG. 15.

As will be seen, using this approach, the resistance of the device 30 in its erased state is much greater than in the prior art erased state, providing an erased state of much larger ON-OFF ratio. Furthermore, the range of potentials which achieve erase of a programmed device 30 is greatly increased as compared to the previous approach. These features result in more efficient erasing of the device 30. Additionally, using this approach, leakage current of the device 30 in its erased state is reduced. Improvement in erase capability can be optimized by selecting anneal temperatures within the ranges cited above.

Figure 16:
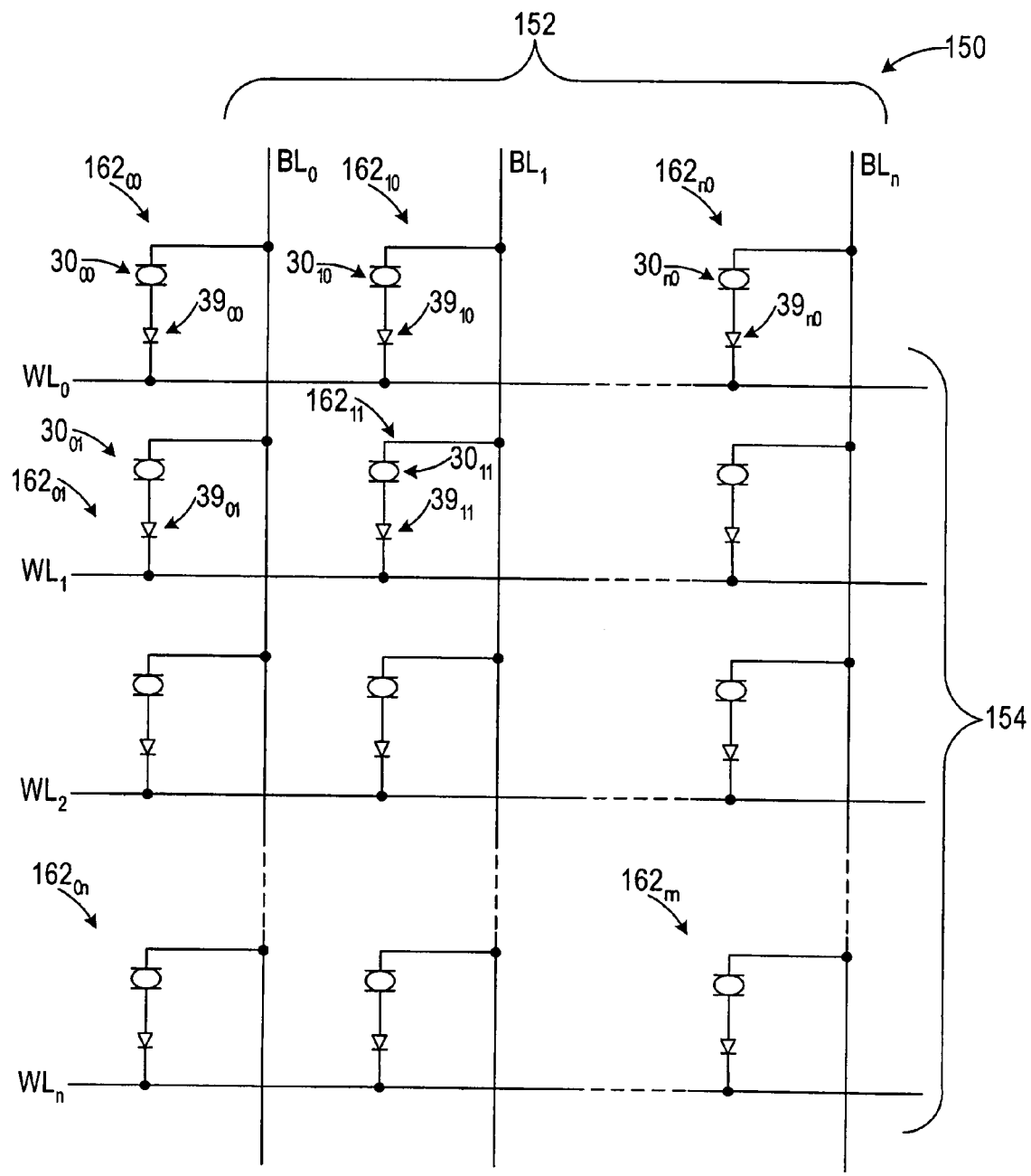
FIGS. 16 and 17 illustrate arrays incorporating the present memory device.

FIG. 16 illustrates a high density memory device array 150 which incorporates memory devices 30 as described above and diodes 39. As illustrated in FIG. 16, the memory device array 150 includes a first plurality 152 of parallel conductors (bit lines) $BL_0, BL_1, \ldots BL_n$, and a second plurality 154 of parallel conductors (word lines) $WL_0, WL_1, \ldots WL_n$ overlying and spaced from, orthogonal to, and crossing the first plurality of conductors 152. A plurality of memory devices 30 are included, each in series with a diode 39, to form a memory device-diode structure 162 which connects a bit line with a word line at the intersection thereof, with the diode in a forward direction from the bit line to the word line. Each memory device-diode structure 162 may be manufactured as a stacked structure, so that efficient manufacturing thereof is achieved.

Figure 17:
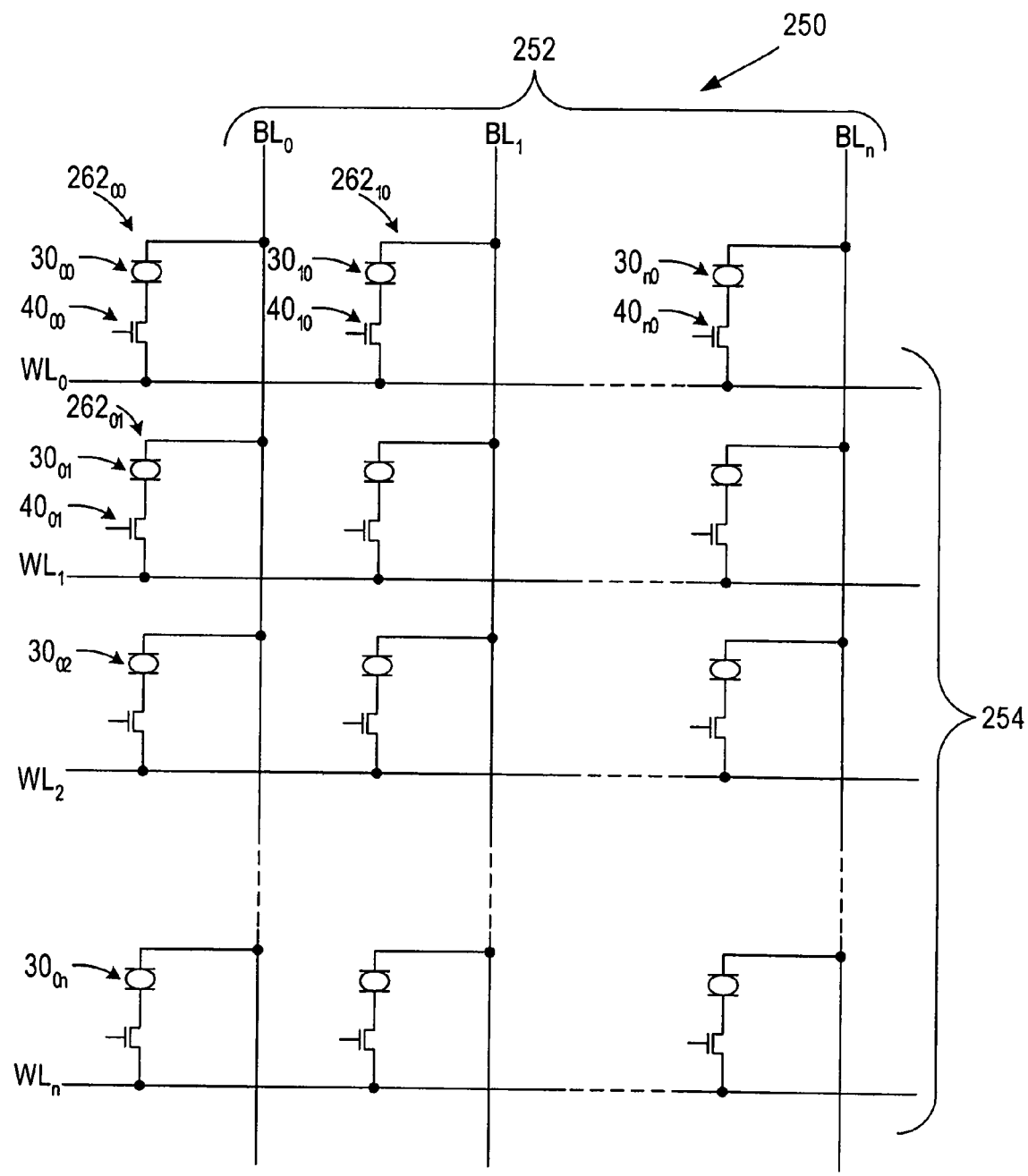

FIG. 17 illustrates another high density memory device array 250 which incorporates memory devices 30 and transistors 40 as described above. As illustrated in FIG. 17, the memory device array 250 includes a first plurality 252 of parallel conductors (bit lines) $BL_0, BL_1, \ldots BL_n$, and a second plurality 254 of parallel conductors (word lines) $WL_0, WL_1, \ldots WL_n$ overlying and spaced from, orthogonal to, and crossing the first plurality of conductors 252. A plurality of memory devices 30 are included, each in series with a transistor 40, to form a memory device-transistor structure 262 which connects a bit line with a word line at the intersection thereof. The transistors 40 act as select devices for the associated memory devices 30.

FIG. 18 illustrates a system 300 utilizing memory devices as described above. As shown therein, the system 300 includes hand-held devices 302 in the form of cell phones, which communicate through an intermediate apparatus such as a tower 304 (shown) and/or a satellite. Signals are provided from one cell phone to the other through the tower 304. Such a cell phone with advantage uses memory devices of the type described above for data storage, for example names, telephone number and other data. One skilled in the art will readily understand the advantage of using such memory devices in other hand-held devices 302 which utilize data storage, such as portable media players, personal digital assistants, digital cameras and the like.

FIG. 19 illustrates another system 400 utilizing memory devices as described above. The system 400 includes a vehicle 402 having an engine 404 controlled by an electronic control unit 406. The electronic control unit 406 with advantage uses memory devices of the type described above for data storage, for example data relating to engine and vehicle operating conditions.

FIG. 20 illustrates yet another system 500 utilizing memory devices as described above. This system 500 is a computer 502 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The memory with advantage uses memory devices of the type described above for storage of any data which is of use.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method for forming a resistive memory device which has a first resistance in an erased state, the method comprising providing that the memory device has in the erased state a second resistance different from the first resistance.

2. The method of claim 1 further providing that the second resistance is greater than the first resistance.

3. The method of claim 2 wherein the step of providing that the memory device has in said erased state a second resistance different from the first resistance comprises heating the memory device.

4. The method of claim 3 wherein the heating is part of an anneal process.

5. The method of claim 1 wherein the resistive memory device comprises a first electrode comprising aluminum, a second electrode, and an insulating layer comprising Ta oxide between the first and second electrodes, wherein the step of providing that the memory device has in said erased state a second resistance different from the first resistance comprises reacting aluminum of the first electrode with Ta oxide of the insulating layer.

6. The method of claim 1 wherein the resistive memory device is included in an array.

7. The method of claim 1 and further comprising said memory device incorporated in a system.

8. The method of claim 7 wherein the system is selected from the group consisting of a hand-held device, a vehicle, and a computer.

9. A method of providing an operating characteristic for a resistive memory device that comprises a first electrode comprising aluminum, a second electrode, a Ta oxide layer between the first and the second electrode, and an Al oxide layer between the first and the second electrode, the method comprising reacting aluminum of the first electrode with Ta oxide of the insulating layer.

10. The method of claim 9 wherein the operating characteristic is an erase characteristic.

11. The method of claim 9 wherein the operating characteristic is a programming characteristic.

12. A method of establishing a resistance level of a high-resistance-state resistive memory device, the method comprising heating the resistive memory device wherein the resistance level of the high-resistance-state resistive memory device is increased upon heating of the resistive memory device and wherein the heating is part of an anneal process.

13. The method of claim 12 wherein the resistive memory device comprises a first electrode comprising aluminum, a second electrode, and an insulating layer comprising Al oxide and Ta oxide between the first and second electrodes, and wherein heating of the resistive memory device causes reaction of aluminum of the first electrode with Ta oxide of the insulating layer.

14. A method of providing an erase characteristic of a resistive memory device which is erased by application thereto of one of a plurality of electrical potentials within a range of electrical potentials, comprising providing that the resistive memory device is also erased by application thereto of one of a plurality of electrical potentials within a second range of electrical potentials different from the first range of electrical potentials.

15. The method of claim 14 wherein the second range of electrical potentials is greater that the first range of electrical potentials.

16. The method of claim 15 wherein the first range of electrical potentials lies within the second range of electrical potentials.

17. The method of claim 14 wherein the step of providing that the resistive memory device may be erased by application thereto of any of a plurality of electrical potentials within a second range of electrical potentials different from the first range of electrical potentials comprises heating the resistive memory device sufficiently to provide that the resistive memory device may be erased by application thereto of any of the plurality of electrical potentials within the second range of electrical potentials different from the first range of electrical potentials.

18. The method of claim 17 wherein the heating step is part of an anneal process, wherein the characteristic that the resistive memory device may be erased by application thereto of any of a plurality of electrical potentials within a second range of electrical potentials different from the first range of electrical potentials is retained after cooling in the anneal process.

19. The method of claim 14 wherein the resistive memory device comprises a first electrode comprising aluminum, a second electrode, and an insulating layer comprising Al oxide and Ta oxide between the first and second electrodes, wherein the step of providing that the resistive memory device may be erased by application thereto of any of a plurality of electrical potentials within a second range of electrical potentials different from the first range of electrical potentials comprises reacting aluminum of the first electrode with Ta oxide of the insulating layer.

\* \* \* \* \*